(12) United States Patent
Horikawa (10) Patent No.: US 9,653,704 B2
(45) Date of Patent: May 16, 2017

(54) DISPLAY PANEL

(71) Applicant: JOLED INC., Tokyo (JP)

(72) Inventor: Keiji Horikawa, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/025,416

(22) PCT Filed: May 11, 2015

(86) PCT No.: PCT/JP2015/002383
§ 371 (c)(1),
(2) Date: Mar. 28, 2016

(87) PCT Pub. No.: WO2015/174071
PCT Pub. Date: Nov. 19, 2015

(65) Prior Publication Data
US 2016/0226027 A1    Aug. 4, 2016

(30) Foreign Application Priority Data

May 13, 2014  (JP) ................................ 2014-099174

(51) Int. Cl.
*H01L 51/52* (2006.01)
*H01L 27/32* (2006.01)
*H05B 33/04* (2006.01)

(52) U.S. Cl.
CPC ...... *H01L 51/5259* (2013.01); *H01L 27/3244* (2013.01); *H01L 51/5246* (2013.01); *H05B 33/04* (2013.01)

(58) Field of Classification Search
CPC ............ H01L 51/5259; H01L 27/3244; H01L 51/5246; H05B 33/04
See application file for complete search history.

(56) References Cited

U.S. PATENT DOCUMENTS 7,306,346 B2  12/2007  Fukuoka et al.
9,095,018 B2   7/2015  Masuda
(Continued)

FOREIGN PATENT DOCUMENTS

JP    11-121165      4/1999
JP    2005-340020   12/2005
(Continued)

OTHER PUBLICATIONS

International Search Report (ISR) from International Searching Authority (Japan Patent Office) in International Pat. Appl. No. PCT/JP2015/002383, dated Jul. 7, 2015.

*Primary Examiner* — Karen Kusumakar
(74) *Attorney, Agent, or Firm* — Greenblum & Bernstein, P.L.C.

(57) ABSTRACT

A display panel includes: a first substrate; a display unit disposed on a principal surface of the first substrate; a first sealing wall disposed in a frame shape on the principal surface of the first substrate, along an outer periphery of the first substrate; a second sealing wall disposed in a frame shape on the principal surface of the first substrate, along an outer periphery of the display unit; a desiccant material filled between the first sealing wall and the second sealing wall; a protective material filled on the display unit, in a region surrounded by the second sealing wall; and a second substrate. The second sealing wall covers at least a portion of a surface of the display unit opposite a surface of the display unit which is in contact with the first substrate.

2 Claims, 7 Drawing Sheets (56) References Cited

U.S. PATENT DOCUMENTS

| | | |
|---|---|---|
| 9,155,135 B2 | 10/2015 | Okumura |
| 2005/0269926 A1 | 12/2005 | Fukuoka et al. |
| 2006/0103295 A1 | 5/2006 | Hubert et al. |
| 2008/0157656 A1* | 7/2008 | Liao ....................... B82Y 20/00 |
| | | 313/504 |
| 2008/0185960 A1 | 8/2008 | Koshiyama |
| 2010/0215929 A1* | 8/2010 | Seo .................... H01L 51/5237 |
| | | 428/213 |
| 2013/0240848 A1* | 9/2013 | Lin ........................ H01L 51/52 |
| | | 257/40 |

FOREIGN PATENT DOCUMENTS

| | | |
|---|---|---|
| JP | 2007-073459 | 3/2007 |
| JP | 2008-520007 | 6/2008 |
| JP | 2008-210788 | 9/2008 |
| WO | 2007/011414 | 1/2007 |

* cited by examiner

Prior Art

FIG. 12B

Prior Art

DISPLAY PANEL

TECHNICAL FIELD

The present invention relates to display panels which display image data.

BACKGROUND ART

In recent years, there have been techniques available for preventing moisture from entering a display panel (see, for example, PTL 1).

PTL 1 discloses, as a display panel, an organic electroluminescent (EL) device including: a substrate; a light emitting element on the substrate; a protective layer covering the light emitting element; a first sealing wall disposed on the protective layer to cover the light emitting element; a desiccant which surrounds the first sealing wall; a second sealing wall which surrounds the desiccant; and a sealing substrate opposing the substrate to sandwich the first sealing wall, the desiccant, and the second sealing wall therebetween.

CITATION LIST

Patent Literature

[PTL 1] Japanese Unexamined Patent Application Publication No. 2007-073459

SUMMARY OF INVENTION

Technical Problem

Along with recent demand for smaller components and space saving, the frames of display panels have been narrowed.

Spaces around the display panel are limited. Hence, in order to narrow the frame of the display panel, the amount of desiccant provided around the panel needs to be reduced. This results in insufficient amount of desiccant for drying. Accordingly, the desiccant is unlikely to sufficiently absorb moisture externally entering the display panel. Additionally, providing the sufficient amount of desiccant for drying around the panel may result in a contact between the light-emitting element and the desiccant, which hinders light emission of the light-emitting element.

In view of the above problem, an object of the present invention is to provide a display panel which is capable of sufficiently absorbing moisture entering the display panel, even if the display panel has a narrower frame.

Solution to Problem

In order to achieve the above object, a display panel according to one aspect of the present invention includes: a first substrate; a display unit disposed on a principal surface of the first substrate; a first sealing wall disposed in a frame shape on the principal surface of the first substrate, along an outer periphery of the first substrate; a second sealing wall disposed in a frame shape on the principal surface of the first substrate, along an outer periphery of the display unit; a desiccant material filled between the first sealing wall and the second sealing wall; a protective material filled on the display unit, in a region surrounded by the second sealing wall; and a second substrate disposed on the first sealing wall, the second sealing wall, the desiccant material, and the protective material. The second sealing wall covers at least a portion of a surface of the display unit, the surface being opposite a surface of the display unit which is in contact with the first substrate.

Advantageous Effects of Invention

The present invention provides a display panel which is capable of sufficiently absorbing moisture entering the display panel even if the display panel has a narrower frame.

DESCRIPTION OF EMBODIMENTS

Although a display panel according to the present invention is described hereafter based on the embodiment, the present invention is defined based on the recitations of the Claims. Therefore, among the elements in the following embodiment, elements not recited in any one of the claims are not necessarily required to achieve the object of the present invention, but are described as elements of a more preferable embodiment. Moreover, the respective figures are schematic and are not necessarily exact illustrations.

(Underlying Knowledge Forming the Basis of the Present Disclosure)

First, underlying knowledge forming the basis of the present disclosure is described below.

Figure 12A:
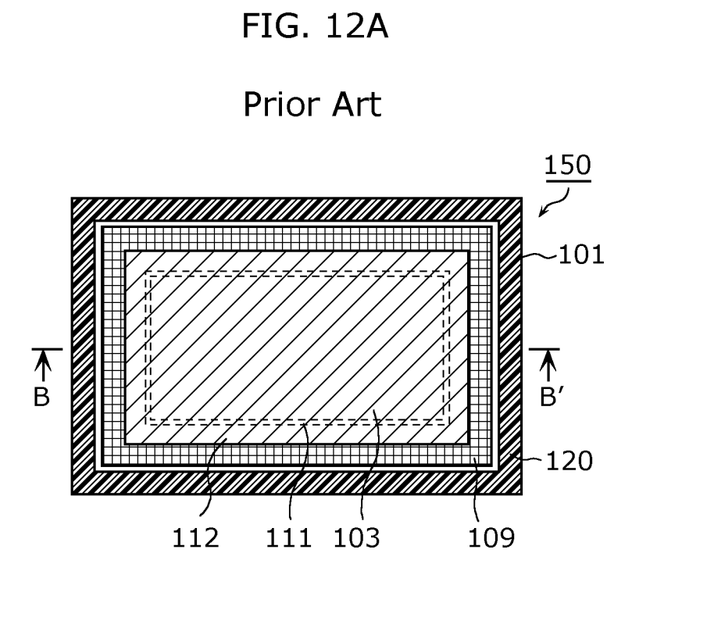
FIG. 12A schematically illustrates a configuration of a display panel according to a conventional technique.
Figure 12B:
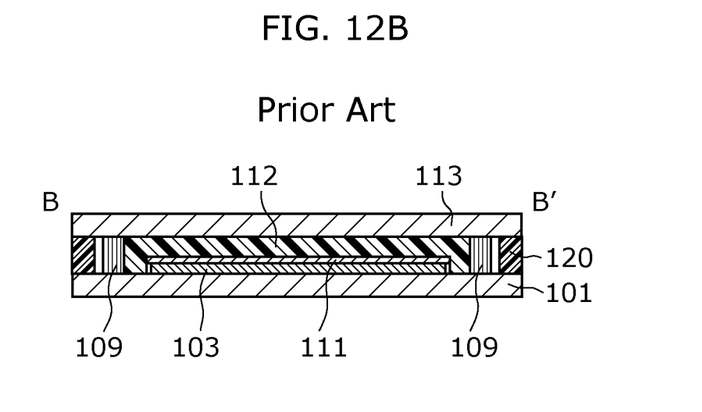
FIG. 12B is a cross-sectional view of the display panel taken along line BB' in FIG. 12A.

FIG. 12A schematically illustrates a configuration of a display panel according to a conventional technique (top view), and FIG. 12B is a cross-sectional view of the display panel taken along line BB' in FIG. 12A.

As FIG. 12A and FIG. 12B illustrate, a display panel 150 according to the conventional technique includes: a substrate 101; a light emitting element 103 on the substrate 101; a protective layer 111 covering the light emitting element 103; a first sealing wall 112 disposed on the protective layer 111 to cover the light emitting element 103; a desiccant 109 which surrounds the first sealing wall 112; a second sealing wall 120 which surrounds the desiccant 109; and a sealing substrate 113 opposing the substrate 101 to sandwich the first sealing wall 112, the desiccant 109 and the second sealing wall 120 therebetween. The display panel 150 is an organic EL device including an organic EL element as the light emitting element 103.

The display panel 150 includes the desiccant 109 on the substrate 101 so as to surround the light emitting element 103 in order to prevent external entry of moisture. More specifically, the desiccant 109 is disposed outside the region where the light emitting element 103 is disposed, along the outer periphery of the display panel 150. In other words, the desiccant 109 is disposed in a so-called frame portion of the display panel 150. In response to the recent demand for a narrower frame, the width of the frame portion of the display panel 150 (the width of the frame portion in a top view) may be reduced by using a less amount of the desiccant 109 to reduce the width of the desiccant 109 (the width of the desiccant 109 in a top view). In this case, since a sufficient amount of the desiccant 109 for drying cannot be disposed, it is not possible for the desiccant to sufficiently absorb the moisture externally entering the display panel.

Additionally, disposing sufficient amount of desiccant 109 for drying around the display panel 150 requires the desiccant 109 to be positioned in proximity to the light emitting element 103. This may cause the light emitting element 103 to contact the desiccant 109. Such a contact between the light emitting element 103 and the desiccant 109, for example, hinders light emission of the light emitting element 103.

In view of the above, in the following embodiment, a display panel will be described which is capable of sufficiently absorbing moisture entering the display panel even if the display panel has a narrower frame.

(Embodiment)

Figure 1A:
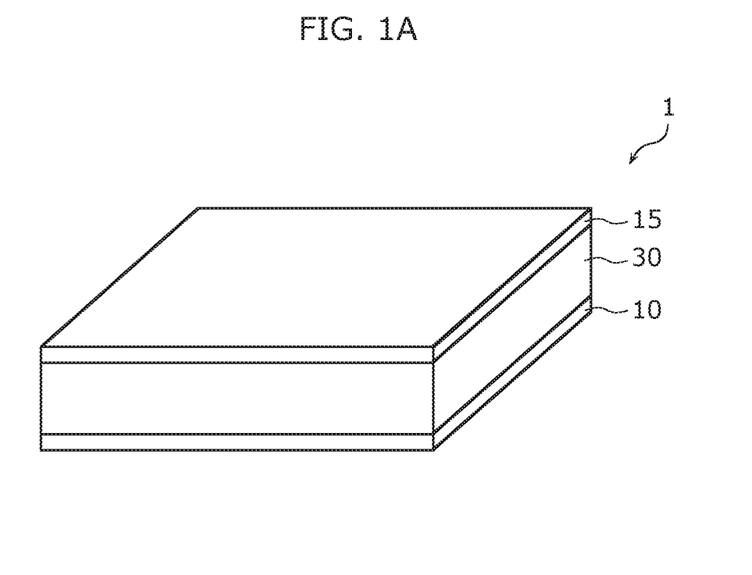
FIG. 1A is a perspective view of an appearance of a display panel according to an embodiment.
Figure 1B:
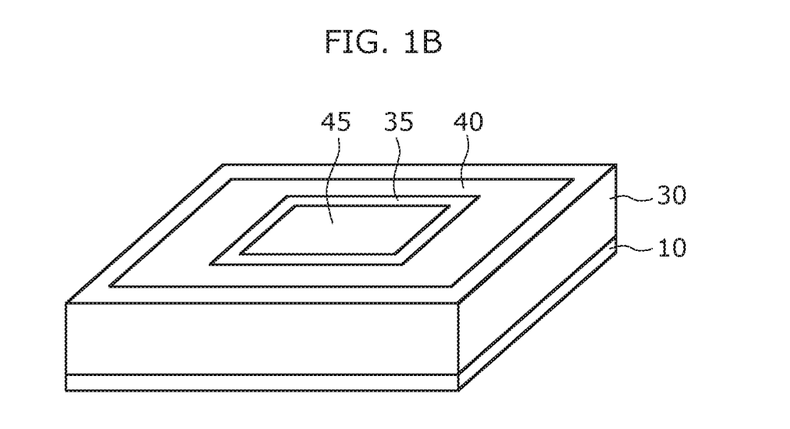
FIG. 1B is a perspective view of a configuration of a portion of the display panel according to the embodiment.
Figure 1C:
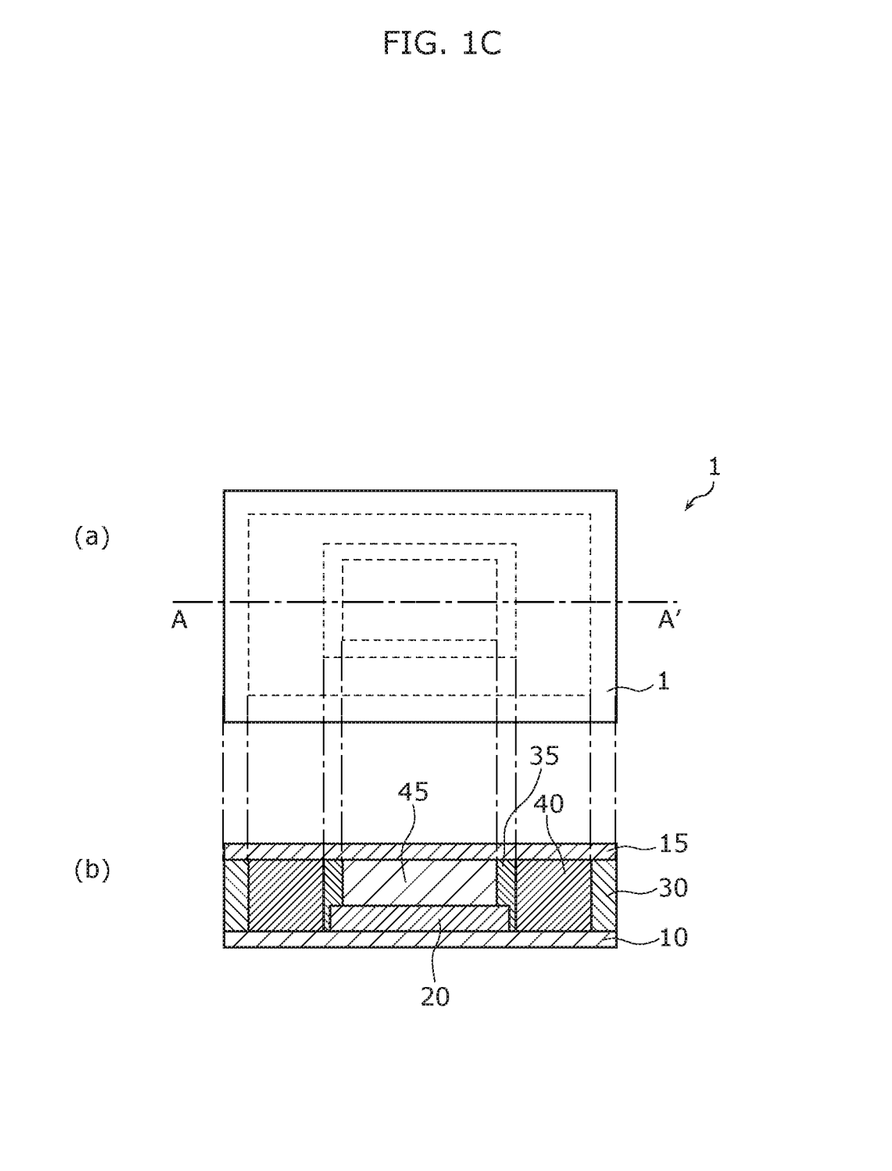
FIG. 1C is a schematic view in (a) and (b) of a configuration of the display panel according to the embodiment.

A display panel 1 according to an embodiment will be described. FIG. 1A is a perspective view of an appearance of the display panel 1. FIG. 1B is a perspective view of a configuration of a portion of the display panel illustrated in FIG. 1A. FIG. 1C is a schematic view of a configuration of the display panel 1, where (a) is a top view of the display panel 1 and (b) is a cross-sectional view of the display panel 1 taken along line AA' in (a).

The display panel 1 is a top-emission display panel. The display panel 1 includes: substrates 10 and 15; a display unit 20; a first sealing wall 30; a second sealing wall 35; a desiccant material 40; and a protective material 45.

As FIG. 1A illustrates, the substrates 10 and 15 and the first sealing wall 30 of the display panel 1 can be externally seen. As FIG. 1B illustrates, with the substrate 15 illustrated in (a) of FIG. 1C removed from the display panel 1, the first sealing wall 30 disposed in a frame shape along the outer periphery of the substrate 10, the second sealing wall 35 disposed in a frame shape in an inner region of the first sealing wall 30, the desiccant material 40 filled between the first sealing wall 30 and the second sealing wall 35, and the protective material 45 filled in the region surrounded by the second sealing wall 35 can be externally seen.

The substrate 10 corresponds to a first substrate according to the present invention. The substrate 10 is, for example, a transistor substrate (thin film transistor (TFT) substrate) on which transistors included in pixels are formed. A plurality of organic EL elements are disposed on the substrate 10.

A display unit 20 is disposed on the principal surface of the substrate 10, that is, on the top surface of the substrate 10 illustrated in (b) of FIG. 1C.

The display unit 20 includes a plurality of pixels which are arranged in a matrix. Each pixel includes, for example, a light emitting element (not illustrated) and semiconductor elements (not illustrated) such as TFTs. The light emitting element is formed of, for example, an organic EL element. The organic EL element at least includes a cathode, an anode, and an organic EL layer disposed between the cathode and the anode. The cathode is disposed on the principal surface of the substrate 10.

The first sealing wall 30 is disposed in a frame shape on the top surface of the substrate 10, along the outer periphery of the substrate 10. The first sealing wall 30 has a viscosity, for example, ranging from 10 Pa·s to 1000 Pa·s, both inclusive. The first sealing wall 30 has a width of, for example, approximately 0.5 mm. The first sealing wall 30 may have any value of optical transmittance.

The first sealing wall 30 is made of, for example, photo-curing epoxy resin. The first sealing wall 30 may be made of materials other than photo-curing epoxy resin, such as other photo-curing resin or thermosetting resin. It is preferable that the first sealing wall 30 is made of materials having stable adhesive strength to adhere the substrate 10 and the substrate 15. It is also preferable that the first sealing wall 30 has high airtightness and is made of materials having a low moisture permeability.

As (a) of FIG. 1C illustrates, the second sealing wall 35 is disposed in a frame shape on the top surface of the substrate 10, in the region surrounded by the first sealing wall 30. The second sealing wall 35 is disposed so as to cover the outer periphery of the display unit 20. Here, the second sealing wall 35 covers at least a portion of the top surface of the display unit 20, that is, covers at least a portion of a surface of the display unit 20 which is not in contact with the substrate 10. In other words, as (b) of FIG. 1C illustrates, the second sealing wall 35 is in contact with the principal surface 10, the side surfaces of the display unit 20, and a portion of a surface of the display 20 which is not in contact with the principal surface of the substrate 10. The second sealing wall 35 has a width of, for example, approximately 0.5 mm.

The second sealing wall 35 is made of, for example, photo-curing epoxy resin. It is preferable that the material of the second sealing wall 35 has a high optical transmittance, and has a viscosity greater than those of the desiccant material 40 and the protective material 45. The second sealing wall 35 including a material having a viscosity greater than those of the desiccant material 40 and the protective material 45 facilitates the configuration of the display panel 1 illustrated in (b) of FIG. 1C. The material of the second sealing wall 35 has a viscosity, for example, ranging from 10 Pa·s to 1000 Pa·s, both inclusive. The above range of the viscosity is a range where liquid droplets of the second sealing wall 35 can be ejected to the above position and the ejected droplets do not spread on the principal surface of the substrate 10 for a predetermined period after the ejection.

It is preferable that the material of the second sealing wall 35 has a high optical transmittance that is an optical transmittance close to 100%. Use of the material having a high optical transmittance for the second sealing wall 35 allows light emitted from the display unit 20 to be emitted from the display panel 1 without being blocked by the second sealing wall 35 even if the edge portions of the display unit 20 are partially covered with the second sealing wall 35. The optical transmittance of the second sealing wall 35 is, for example, 85% or higher. The material of the second sealing wall 35 may be the same as that of the first sealing wall 30.

The desiccant material 40 is filled between the first sealing wall 30 and the second sealing wall 35. In a top view, the desiccant material 40 is disposed in a frame shape between the first sealing wall 30 and the second sealing wall 35. The frame of the desiccant material 40 has a thickness, for example, ranging from 3 mm to 4 mm, both inclusive. The desiccant material 40 includes an organic compound including a moisture absorbent which absorbs moisture. The percentage of the moisture absorbent included in the organic compound is, for example, 30%.

It is preferable that the moisture absorbent is a material which is unlikely to react with an organic compound. As the moisture absorbent, for example, calcium oxide is used. Examples of the material of the moisture absorbent other than calcium oxide include calcium hydroxide, strontium hydroxide, barium hydroxide, aluminum hydroxide, sodium oxide, potassium oxide, barium oxide, and magnesium oxide.

The organic compound as solvent may be, for example, resin. Other examples of the organic compound as solvent include resin materials such as polyethylene resin and polypropylene resin, and materials such as wax and oil.

The second sealing wall 35 is disposed on the top surface of the substrate 10, between the display unit 20 and the desiccant material 40. Comparing the size of the display unit 20 with the size of the second sealing wall 35, the length of the outer periphery of the display unit 20 is greater than the length of the inner periphery of the second sealing wall 35 and is less than the length of the outer periphery of the second sealing wall 35. Specifically, the length of the long side of the display unit 20 is greater than the long side of the inner periphery of the second sealing wall 35, and is less than the length of the long side of the outer periphery of the second sealing wall 35. The length of the short side of the display unit 20 is greater than the short side of the inner periphery of the second sealing wall 35, and is less than the length of the short side of the outer periphery of the second sealing wall 35. This prevents the display unit 20 from directly contacting the desiccant material 40. As a result, light emission of the display unit is not hindered.

The protective material 45 is made of, for example, thermo-setting resin or ultraviolet curable resin. The protective material 45 is made of, for example, photo-curing epoxy resin.

The protective material 45 is required to spread widely and evenly within the region surrounded by the second sealing wall 35, and thus, a material having a viscosity less than that of the second sealing wall 35 is used for the protective material 45. The viscosity of the protective material 45 ranges, for example, from 10 mPa·s to 1000 mPa·s, both inclusive.

Since the protective material 45 is disposed on the display unit 20, it is necessary for the protective material 45 to transmit light emitted from the display unit 20. Accordingly, as the material for the protective material 45, a material having a high optical transmittance is used. The optical transmittance of the protective material 45 is, for example, 85% or higher. Use of the material having a high optical transmittance for the second sealing wall 35 allows light emitted from the display unit 20 to be emitted from the display panel 1 without being blocked by the second sealing wall 35 even if at least a portion of the surface of the display unit 20 on which the substrate 10 is not disposed is covered with the second sealing wall 35.

Accordingly, the light emitted from the display unit 20 transmits the protective material 45, and thus, the light emitted from the display unit 20 is emitted from the display panel 1 without being blocked by the second sealing wall 35.

It is preferable that a low-modulus material is used for the protective material 45 because the protective material 45 is disposed in contact with the display unit 20. With this, stress which acts on the display unit 20 can be reduced.

The substrate 15 corresponds to a second substrate according to the present invention. The substrate 15 is disposed on the first sealing wall 30, the second sealing wall 35, the desiccant material 40, and the protective material 45 so as to sandwich the first sealing wall 30, the second sealing wall 35, the desiccant material 40, and the protective material 45 between the substrate 15 and the substrate 10. Accordingly, as (b) of FIG. 1C illustrates, the display panel 1 has a configuration that the second sealing wall 35, the desiccant material 40, the protective material 45, and the display unit 20 are sealed by the substrate 10, the substrate 15, and the first sealing wall 30.

Hereinafter, each element will be described.

The substrate 15 is made of, for example, a transparent glass. The substrate 15 is not necessary made of a glass, but may be made of any other light-transmissive materials, such as quartz or synthetic resin. It is preferable that the substrate 15 is made of a material having a low moisture permeability.

In the display panel 1, the frame portion is an outer region of the display unit 20, that is, a region including the first sealing wall 30, the desiccant material 40, and a portion of the second sealing wall 35 which is not covering the display unit 20.

Such a configuration of the display panel 1 allows moisture entering the panel from being sufficiently absorbed even if the display panel 1 has a narrower frame.

Hereinafter, manufacturing processes of the display panel 1 will be described. FIG. 2 to FIG. 9 are cross-sectional views of the manufacturing processes of the display panel according to the embodiment.

The display panel 1 according to the embodiment will be manufactured as below. At the time of manufacturing of the display panel 1, the top side of the configuration illustrated in (b) of FIG. 1C, that is, the substrate 15 side will be first manufactured. Accordingly, for the purpose of illustration, each of FIG. 2 to FIG. 8 below is the cross-section illustrated in (b) of FIG. 1C vertically inverted.

Figure 2:
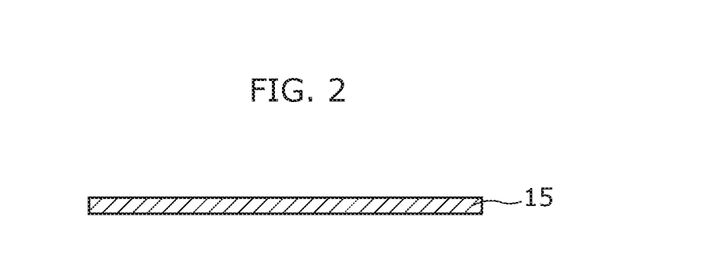
FIG. 2 is a cross-sectional view of a part of manufacturing processes of the display panel according to the embodiment.

First, as FIG. 2 illustrates, the substrate 15 is prepared. The substrate 15 is made of, for example, a transparent glass, and has a rectangular plate-like shape with a length of 1.1 m, a width of 1.3 m, and a thickness of 0.5 mm.

Figure 3:
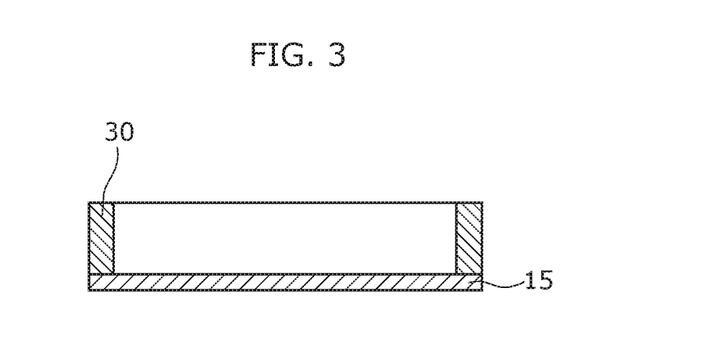
FIG. 3 is a cross-sectional view of a part of the manufacturing processes of the display panel according to the embodiment.

Next, as FIG. 3 illustrates, the first sealing wall 30 having a thickness of 15 μm is formed along the outer periphery of the substrate 15. The first sealing wall 30 is in a liquid form having viscosity before curing. The first sealing wall 30 is made of photo-curing epoxy resin having a viscosity of 450 Pa·s. The liquid droplets of the first sealing wall 30 are ejected along the outer periphery of the substrate 15 by a dropping apparatus.

Figure 4:
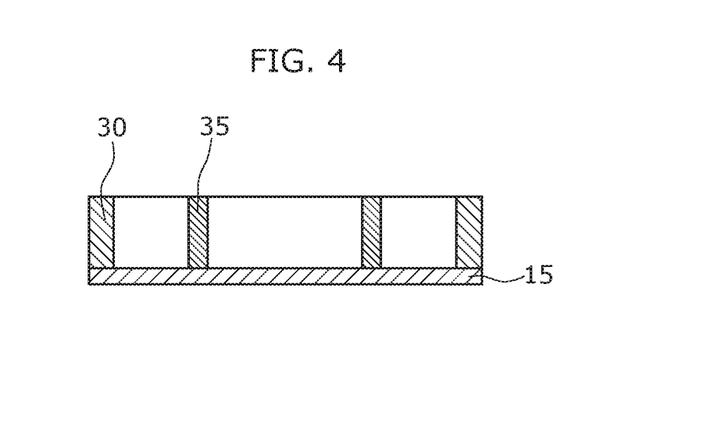
FIG. 4 is a cross-sectional view of a part of the manufacturing processes of the display panel according to the embodiment.

Next, as FIG. 4 illustrates, the second sealing wall 35 is formed so as to surround a given inner region of the substrate 15. The second sealing wall 35 is in a liquid form having viscosity before curing. The second sealing wall 35 is made of photo-curing epoxy resin having a viscosity of 400 Pa·s. The liquid droplets of the second sealing wall 35 are ejected by a dropping apparatus. The second sealing wall 35 is disposed so as to have a same height as the first sealing wall 30. As described later, the display unit 20 will be disposed in the inner region of the second sealing wall 35.

Figure 5:
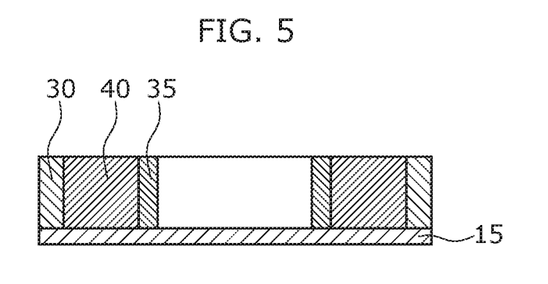
FIG. 5 is a cross-sectional view of a part of the manufacturing processes of the display panel according to the embodiment.

Next, as FIG. 5 illustrates, the desiccant material 40 is formed in a region between the first sealing wall 30 and the second sealing wall 35. The desiccant material 40 includes the liquid photo-curing epoxy resin having a viscosity of 200 Pa·s where 30% thereof is calcium oxide serving as a moisture absorbent. The viscosity of the desiccant material 40 is less than those of the first sealing wall 30 and the second sealing wall 35. The liquid droplets of the desiccant material 40 are ejected by a dropping apparatus. With this, the desiccant material 40 spreads evenly between the first sealing wall 30 and the second sealing wall 35. The desiccant material 40 is filled so as to have a height same as that of the first sealing wall 30 and that of the second sealing wall 35.

Figure 6:
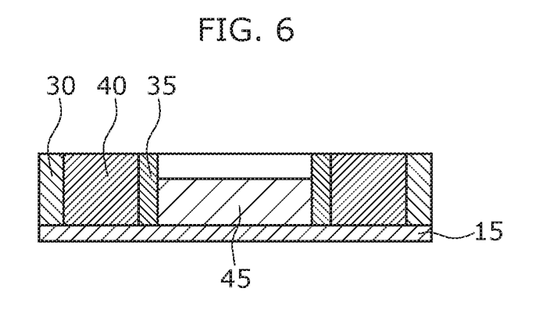
FIG. 6 is a cross-sectional view of a part of the manufacturing processes of the display panel according to the embodiment.

Next, as FIG. 6 illustrates, the protective material 45 is formed inside the region surrounded by the second sealing wall 35. The protective material 45 is made of liquid photo-curing epoxy resin having a viscosity of 0.5 Pa·s before curing. The liquid droplets of the protective material 45 are ejected by a dropping apparatus. The protective material 45 is filled so as to have a height less than the second sealing wall 35 by the height of the display unit 20 to be disposed on the protective material 45.

Subsequently, ultraviolet rays are applied to the substrate 15, the first sealing wall 30, the second sealing wall 35, the desiccant material 40, and the protective material 45. With this, the substrate 15, the first sealing wall 30, the second sealing wall 35, the desiccant material 40, and the protective material 45 are cured.

Figure 7:
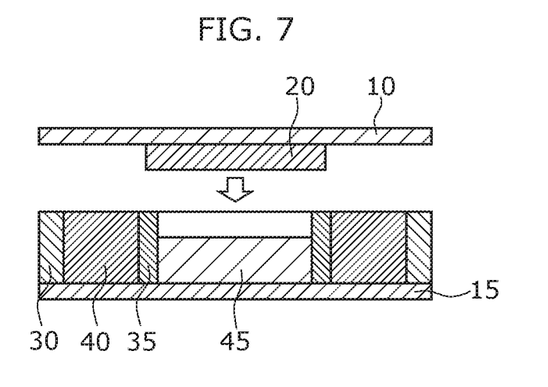
FIG. 7 is a cross-sectional view of a part of the manufacturing processes of the display panel according to the embodiment.

Next, as FIG. 7 illustrates, the substrate 10 to be disposed on the first sealing wall 30, the second sealing wall 35, the desiccant material 40, and the protective material 45 is prepared.

The substrate 10 is made of, for example, a transparent glass having a shape same as that of the substrate 15. The display unit 20 is disposed on the principal surface of the substrate 10. Specifically, the principal surface of the substrate 10 is the surface opposing the first sealing wall 30, the second sealing wall 35, the desiccant material 40, and the protective material 45. The display unit 20 is disposed such that the outer periphery of the display unit 20 opposes the second sealing wall 35.

Figure 8:
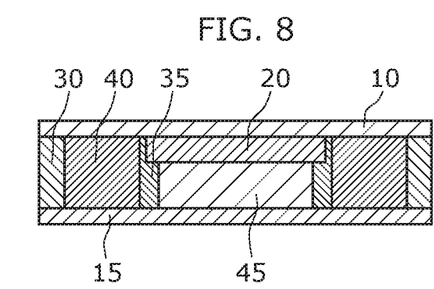
FIG. 8 is a cross-sectional view of a part of the manufacturing processes of the display panel according to the embodiment.

Next, as FIG. 8 illustrates, the substrate 10 is disposed on the first sealing wall 30, the second sealing wall 35, the desiccant material 40, and the protective material 45. Here, the edge portion of the outer periphery of the display unit 20 is disposed so as to be embedded in the second sealing wall 35. Moreover, the substrate 10 is pressed against the first sealing wall 30, the second sealing wall 35, the desiccant material 40, and the protective material 45. The edge portion of the outer periphery of the display unit 20 may be entirely covered with the second sealing wall 35. Depending on the precision of the manufacturing apparatus and the like, the edge portion of the outer periphery of the display unit 20 need not be entirely covered with the second sealing wall 35, but at least a portion of the edge portion of the outer periphery of the display unit 20 may be covered with the second sealing wall 35.

The above processes are performed in vacuum. Subsequently, the first sealing wall 30, the second sealing wall 35, the desiccant material 40, and the protective material 45 on which the substrate 10 has been disposed are taken out into the atmosphere. With this, the substrate 10 is pressed at atmospheric pressure against the first sealing wall 30, the second sealing wall 35, the desiccant material 40, and the protective material 45 on which the substrate 10 has been disposed.

Moreover, the first sealing wall 30, the second sealing wall 35, the desiccant material 40, and the protective material 45 on which the substrate 10 has been disposed are entirely heated. The heating temperature is, for example, 80 degrees Celsius. Accordingly, resin included in the first sealing wall 30, the second sealing wall 35, the desiccant material 40 and the protective material 45 are adhered to the substrate 10. The heating temperature may be other than 80 degrees Celsius. It is preferable that the heating temperature is 100 degrees Celsius or less.

Figure 9:
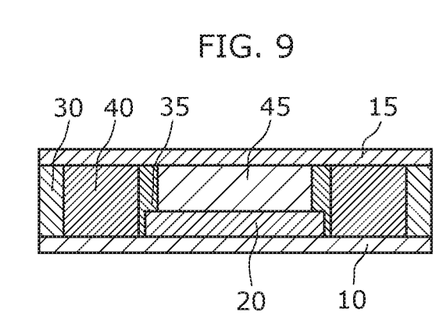
FIG. 9 is a cross-sectional view of a part of the manufacturing processes of the display panel according to the embodiment.

By vertically inverting the display panel 1, as FIG. 9 illustrates, the display panel 1 according to the embodiment is completed.

As described above, the display panel according to the embodiment includes: a first substrate; a display unit disposed on a principal surface of the first substrate; a first sealing wall disposed in a frame shape on the principal surface of the first substrate, along an outer periphery of the first substrate; a second sealing wall disposed in a frame shape on the principal surface of the first substrate, along an outer periphery of the display unit; a desiccant material filled between the first sealing wall and the second sealing wall; a protective material filled on the display unit, in a region surrounded by the second sealing wall; and a second substrate disposed on the first sealing wall, the second sealing wall, the desiccant material, and the protective material. The second sealing wall covers at least a portion of a surface of the display unit, the surface being opposite a surface of the display unit which is in contact with the first substrate. With such a configuration, disposing the second sealing wall 35 between the display unit 20 and the desiccant material 40 prevents the display unit 20 from contacting the desiccant material 40, and thus, light emission of the display unit 20 is not hindered. Accordingly, it is possible to position the desiccant material 40 to be close to the display unit 20.

With this, even if a small amount of the desiccant material 40 is used in the display panel having a narrower frame, the desiccant material 40 is capable of efficiently absorbing the moisture entering the display panel. Moreover, the second sealing wall 35 covering at least a portion of the display unit 20 allows the second sealing wall 35 to be precisely disposed on the surface of the substrate 10 on which the display unit 20 has been disposed, between the display unit 20 and the desiccant material 40.

In the above described display panel 1, the materials for the first sealing wall 30 and the second sealing wall 35 may be the same or may be different. The second sealing wall 35 may cover the entire outer periphery of the display unit 20 or may cover a portion of the outer periphery of the display unit 20.

Moreover, it is sufficient that the region (width) of the display unit 20 covered with the second sealing wall 35 is smaller than the thickness of the frame of the second sealing wall 35. In other words, the second sealing wall 35 may be disposed on the surface of the substrate 10 on which the display unit 20 is disposed, between the display unit 20 and the desiccant material 40. A display panel according to a variation of the embodiment will be described below.

(Variation)

Figure 10:
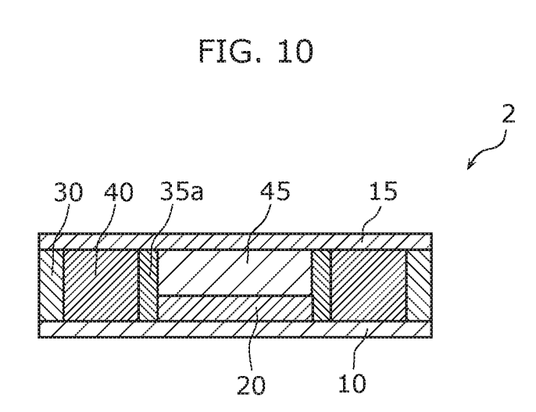
FIG. 10 is a cross-sectional view of a configuration of a display panel according to a variation of the embodiment.

Next, a variation of the embodiment will be described. FIG. 10 is a cross-sectional view of a configuration of a display panel 2 according to the variation.

The display panel 2 according to the variation is different from the display panel 1 according to the embodiment in that a second sealing wall 35a is disposed in contact with both ends of the edge portion of the display unit 20.

As FIG. 10 illustrates, in a similar manner to the display panel 1 according to the embodiment, the display panel 2 includes: the substrates 10 and 15, the display unit 20, the first sealing wall 30, the second sealing wall 35a, the desiccant material 40, and the protective material 45. Since the configurations of the substrates 10 and 15, the display unit 20, the first sealing wall 30, the desiccant material 40, and the protective material 45 are similar to the configuration of the display panel 1, the descriptions thereof are omitted.

The second sealing wall 35a is disposed on the principal surface of the substrate 10, between the display unit 20 and the desiccant material 40, and is in contact with the end portions of the display unit 20 without covering the surface of the display unit 20.

In the manufacturing process of the display panel 2, the liquid droplets of the second sealing wall 35a are ejected by a dropping apparatus. Here, the liquid droplets of the second sealing wall 35a are ejected such that the position of the inner periphery of the second sealing wall 35a match the position of the outer periphery of the display unit 20. Subsequently, the substrate 15, on which the display unit 20 has been disposed, is disposed on the first sealing wall 30, the second sealing wall 35a, the desiccant material 40, and the protective material 45. Here, the edge portion of the outer periphery of the display unit 20 is disposed so as to be in contact with the inner periphery of the second sealing wall 35a.

Moreover, the substrate 10 is pressed against the first sealing wall 30, the second sealing wall 35a, the desiccant material 40, and the protective material 45. The edge portion of the outer periphery of the display unit 20 may be entirely covered with the second sealing wall 35a. Depending on the precision of a manufacturing apparatus and the like, the edge portion of the outer periphery of the display unit 20 need not be entirely covered with the second sealing wall 35a, but at least a portion of the edge portion of the outer periphery of the display unit 20 may be covered with the second sealing wall 35a.

The above processes are performed in vacuum. Subsequently, the first sealing wall 30, the second sealing wall 35a, the desiccant material 40, and the protective material 45 on which the substrate 10 has been disposed are taken out into the atmosphere. With this, the substrate 10 is pressed at atmospheric pressure against the first sealing wall 30, the second sealing wall 35a, the desiccant material 40, and the protective material 45 on which the substrate 10 has been disposed.

Moreover, the first sealing wall 30, the second sealing wall 35a, the desiccant material 40, and the protective material 45 on which the substrate 10 has been disposed are entirely heated. The heating temperature is, for example, 80 degrees Celsius. Accordingly, resin included in the first sealing wall 30, the second sealing wall 35a, the desiccant material 40, and the protective material 45 are adhered to the substrate 10.

With this, the region of the second sealing wall 35a is disposed between the display unit 20 and the desiccant material 40, and thus, the likelihood of contact between the display 20 and the desiccant material 40 is further reduced. Accordingly, the likelihood of hindering the light emission of the display unit 20 is further reduced. With this, even when a small amount of desiccant material 40 is used in a display panel having a narrower frame, moisture entering the display panel can be sufficiently absorbed by the desiccant material 40.

As described above, the display panel according to the embodiment includes: a first substrate; a display unit disposed on a principal surface of the first substrate; a first sealing wall disposed in a frame shape on the principal surface of the first substrate, along an outer periphery of the first substrate; a second sealing wall disposed in a frame shape on the principal surface of the first substrate, along an outer periphery of the display unit; a desiccant material filled between the first sealing wall and the second sealing wall; a protective material filled on the display unit, in a region surrounded by the second sealing wall; and a second substrate disposed on the first sealing wall, the second sealing wall, the desiccant material, and the protective material. The second sealing wall covers at least a portion of a surface of the display unit, the surface being opposite a surface of the display unit which is in contact with the first substrate.

With such a structure, disposing the second sealing wall between the display unit and the desiccant material prevents the display unit from contacting the desiccant material, and thus, light emission of the display unit is not hindered. Accordingly, it is possible to position the desiccant material to be close to the display unit. With this, even when only a small amount of desiccant material is used in a display panel having a narrower frame, moisture entering the display panel can be sufficiently absorbed by the desiccant material.

Moreover, since the second sealing wall covers at least a portion of the display unit, the second sealing wall can be precisely provided on the surface of the first substrate on which the display unit has been disposed, between the display unit and the desiccant material.

The viscosity of the second sealing wall may be greater than those of the desiccant material and the protective material.

With such a configuration, by making the viscosity of the transparent resin of the second sealing wall greater than those of the desiccant material and the protective material, the shape of the second sealing wall is unlikely to be deformed before the second sealing wall is cured in the manufacturing processes. Accordingly, the desiccant material and the protective material are easily filled in the outer and inner regions of the second sealing wall, respectively. This facilitates the configuration of the display panel.

Moreover, the length of the outer periphery of the display unit may be greater than that of the inner periphery of the second sealing wall and less than the length of the outer periphery of the second sealing wall.

With such a configuration, since the second sealing wall covers at least a portion of the display unit, the second sealing wall can be precisely disposed on the surface of the first substrate on which the display unit has been disposed, between the display unit and the desiccant material, (Other Embodiments)

As described above, the above embodiment has been given as an example of the techniques disclosed in the present application. However, the techniques in the present disclosure are not limited to this example; appropriate modifications, interchanges, additions, omissions, etc., to the embodiment are possible. Furthermore, a new embodiment can be formed by combining the respective elements described in the above embodiment.

In view of this, other embodiments are described collectively below.

For example, in the display panel according to the above embodiment, the materials for the first sealing wall and the second sealing wall may be the same or may be different. The second sealing wall may cover the entire outer periphery of the display unit or may cover a portion of the outer periphery of the display unit.

Moreover, the region (width) of the display unit covered with the second sealing wall may be smaller than the thickness of the frame of the second sealing wall. In other words, the second sealing wall may be disposed on the surface of the substrate on which the display unit is disposed, between the display unit and the desiccant material.

Moreover, it may be that the second sealing wall is disposed on the surface of the first substrate on which the display unit is disposed, between the display unit and the desiccant material, and is in contact with the edge portion of the display unit without covering the surface of the display unit.

Moreover, in the above embodiment, the display panel includes an organic EL element as a light emitting element; however, the present invention may be applied to a display panel other than the display panel including the organic EL element as the light-emitting element or other devices. For example, the present invention can also be applied to an electronic device used in a display panel, another electronic device in which an active-matrix substrate is used, a mother board of a panel for a mobile terminal, and so on. In particular, an electronic device having the above configuration can be used as a flat panel display, and can be applied to every electronic device having a display panel, such as a television set, a personal computer, and a cellular phone.

Figure 11:
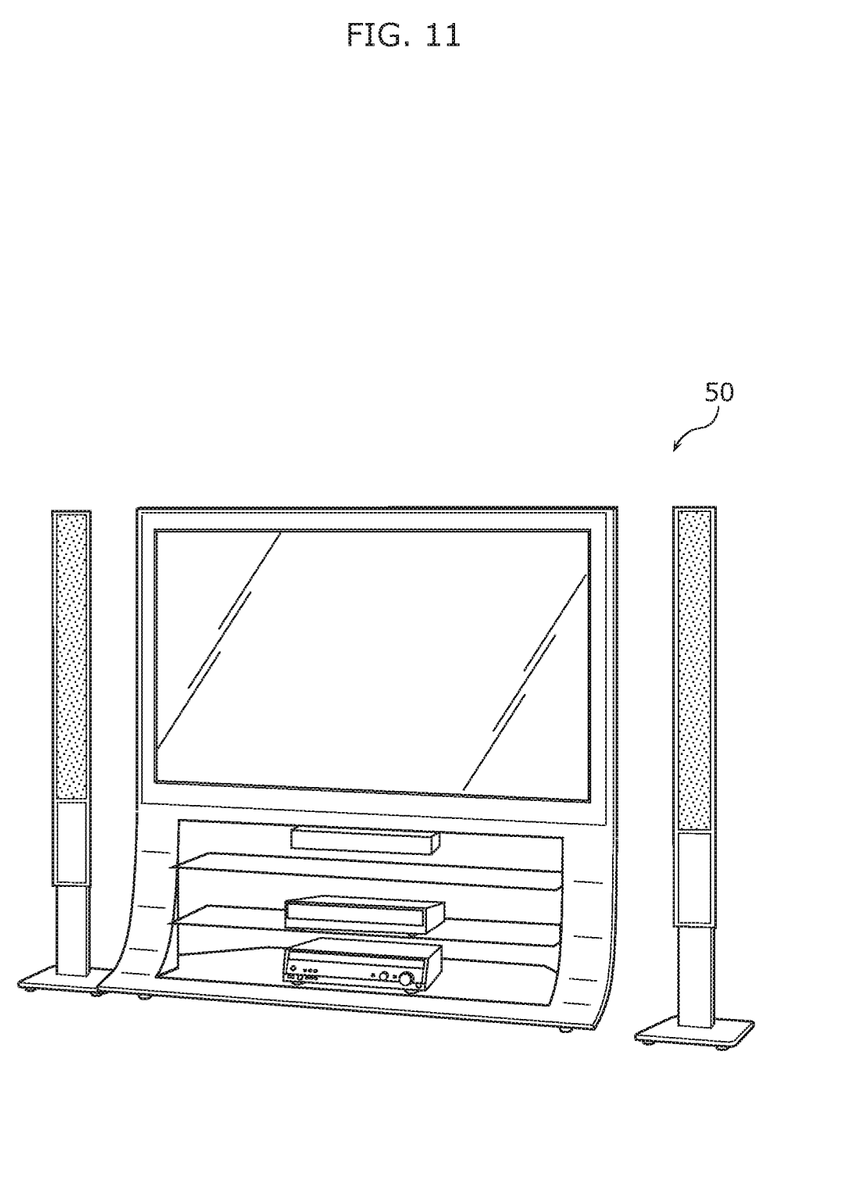
FIG. 11 is an external view of a television system including an organic EL element.

For example, a display panel according to the present invention is built into a thin flat-screen TV such as that illustrated in FIG. 11. A thin flat-screen TV capable of providing precise image display reflecting a video signal is implemented by having the display panel according to the present invention built into the TV.

Moreover, embodiments obtained through various modifications to the respective embodiments which may be conceived by a person skilled in the art as well as embodiments realized by arbitrarily combining the elements and functions of the respective embodiments without materially departing from the spirit of the present invention are included in the present invention.

INDUSTRIAL APPLICABILITY

The display panel according to the present invention can be widely used, for example, for a thin-film TV, a personal computer, a mobile display panel for a cellular phone and the like.

REFERENCE SIGNS LIST 1, 150 display panel
10 substrate (first substrate)
15 substrate (second substrate)
20, 103 display unit
30 first sealing wall
35, 35a second sealing wall
40, 109 desiccant material
45 protective material
101 substrate
111 protective layer (protective material)
112 first sealing wall (protective material)
113 sealing substrate (second substrate)
120 second sealing wall (first sealing wall)

The invention claimed is:

1. A display panel comprising:

a first substrate;

a display unit disposed on a principal surface of the first substrate;

a first sealing wall disposed in a frame shape on the principal surface of the first substrate, along an outer periphery of the first substrate;

a second sealing wall disposed in a frame shape on the principal surface of the first substrate, along an outer periphery of the display unit;

a desiccant material filled between the first sealing wall and the second sealing wall;

a protective material filled on the display unit, in a region surrounded by the second sealing wall; and a second substrate disposed on the first sealing wall, the second sealing wall, the desiccant material, and the protective material, wherein the second sealing wall covers at least a portion of a surface of the display unit, the surface being opposite a surface of the display unit which is in contact with the first substrate; and wherein the outer periphery of the display unit has a length greater than a length of an inner periphery of the second sealing wall and less than a length of an outer periphery of the second sealing wall.

2. The display panel according to claim 1, wherein the second sealing wall has a viscosity greater than a viscosity of the desiccant material and a viscosity of the protective material.

* * * * *